(12) United States Patent
Regev et al.

(10) Patent No.: US 6,944,710 B2
(45) Date of Patent: Sep. 13, 2005

(54) MULTIPLE CATEGORY CAM

(75) Inventors: Alon Regev, Woodland Hills, CA (US); Zvi Regev, West Hills, CA (US)

(73) Assignee: Micron Technology, Inc., Boise, ID (US)

(*) Notice: Subject to any disclaimer, the term of this patent is extended or adjusted under 35 U.S.C. 154(b) by 310 days.

(21) Appl. No.: 10/330,242

(22) Filed: Dec. 30, 2002

(65) Prior Publication Data
US 2004/0128439 A1 Jul. 1, 2004

(51) Int. Cl.[7] .............................................. G06F 12/00
(52) U.S. Cl. ......................... 711/108; 711/128; 365/49
(58) Field of Search ................................ 711/108, 128; 365/49

(56) References Cited

U.S. PATENT DOCUMENTS

| | | | | |
|---|---|---|---|---|
| 5,515,370 A | * | 5/1996 | Rau | 370/399 |
| 6,542,391 B2 | * | 4/2003 | Pereira et al. | 365/49 |
| 6,665,202 B2 | * | 12/2003 | Lindahl et al. | 365/49 |
| 6,757,779 B1 | * | 6/2004 | Wong et al. | 711/108 |

* cited by examiner

Primary Examiner—Nasser Moazzami
(74) Attorney, Agent, or Firm—Dickstein Shapiro Morin & Oshinsky LLP

(57) ABSTRACT

An apparatus and method is disclosed for a CAM match detection circuit with a multiple category CAM circuit. The multiple category CAM circuit provides category association tables to specify which priority encoders are to be used for certain CAM words of an identified category. By using the assigned categories, priority resolvers may efficiently reallocate packet data according to category (e.g., video, voice, graphics, etc.).

20 Claims, 6 Drawing Sheets

MULTIPLE CATEGORY CAM

FIELD OF THE INVENTION

The present invention relates generally to content addressable memories (CAMs), and more specifically, to content addressable memories having category association tables for use in high-speed data communication networks

BACKGROUND OF THE INVENTION

An essential semiconductor device is semiconductor memory, such as a random access memory (RAM) device. A RAM allows a memory circuit to execute both read and write operations on its memory cells. Typical examples of RAM devices include dynamic random access memory (DRAM) and static random access memory (SRAM).

Another form of memory is the content addressable memory (CAM) device. A conventional CAM is viewed as a static storage device constructed of modified RAM cells. A CAM is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data in the comparand register) against the entire list of pre-stored entries. As a result of their unique searching algorithm, CAM devices are frequently employed in network equipment, particularly routers, gateways and switches, computer systems and other devices that require rapid content searching, such as routing tables for data networks or matching URLs. Some of these tables are "learned" from the data passing through the network. Other tables, however, are fixed tables that are loaded into the CAM by a system controller. These fixed tables reside in the CAM for a relatively long period of time. A word in a CAM is typically very large and can be 96 bits or more.

Practically all digital networks make use of some form of packet or block type data format to dynamically route data packets or blocks through the network. The data contained in the packets can be categorized in various ways, including type of packet, packet content, size, creation date, and urgency of delivery, for example. Depending on the purpose of the communications system and the preferences of the user, it may be necessary to limit or expand the amount of bandwidth to be allocated to a particular memory of dRAMs can be particularly beneficial in applications involving resource allocation. For example, when system capacity limitations restrict the amount of data that can be transmitted by the network, or if a user wishes to give priority to certain categories of data over others, CAMS may be used to prioritize the flow of data.

CAMs are also used in communications systems as search engines for routing paths in data network routers and switches. The packets being routed can be viewed as belonging to a particular category of data which, in turn, can impact on how high (or low) a priority the data is assigned and how much bandwidth a user wants to devote to the data. Typically, a CAM issues a single search result that is independent of a category to which the packet belongs. Consequently, it is necessary for the user to handle bandwidth allocation, for example, by assigning categories to CAM searches and transmitting each category to an assigned priority encoder for further processing. A more efficient way of utilizing CAMs as a search engine is needed.

BRIEF SUMMARY OF THE INVENTION

The present invention provides a CAM modified to simultaneously search packet categories in the CAM, and automatically allocate priority resolvers among the categories. The allocation of categories and the categories themselves can be based on various characteristics. For example, data packets can be categorized based on the type of data they carry, such as video, voice, graphic, text, etc. Specific priority resolvers are identified by the user so certain categories of data are given priority over other categories of data. For example, video data can be given priority over graphics data, which, in turn, can be given priority over voice or text data. Other features and advantages of the present invention will become apparent from the following description of the invention which refers to the accompanying drawings.

BRIEF DESCRIPTION OF THE DRAWINGS

The above and other features and advantages of the invention will be more readily understood from the following detailed description of the invention which is provided in connection with the accompanying drawings.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those of ordinary skill in the art to make and use the invention, and it is to be understood that structural, logical or procedural changes may be made to the specific embodiments disclosed without departing from the spirit and scope of the present invention.

Figure 1:
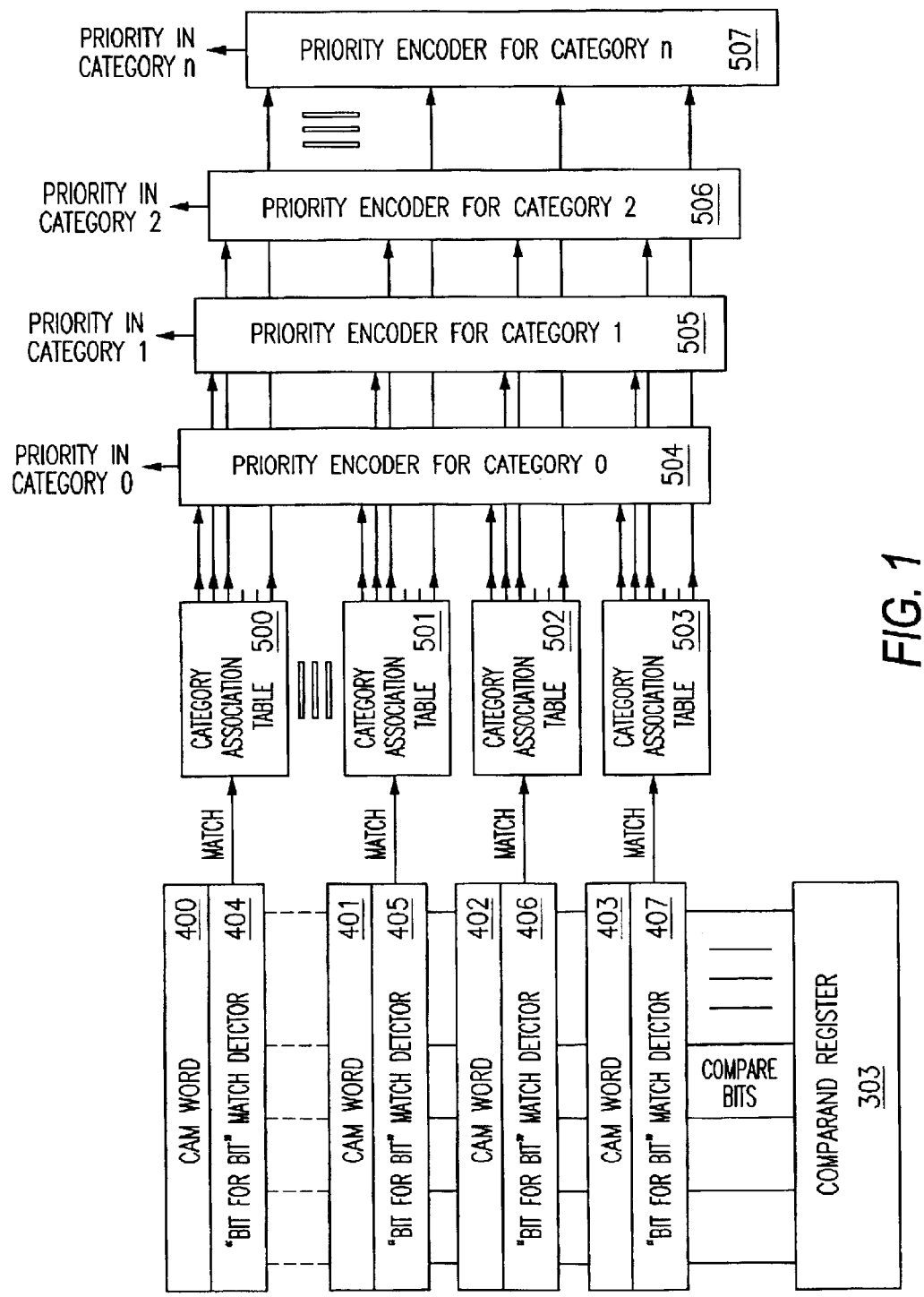
FIG. 1 illustrates a priority match detection and categorization circuit according to an embodiment of the invention.

FIG. 1 discloses a priority match detection and categorization circuit. A comparand register 303 is loaded with search data. The bits in the comparand register 303 are transmitted in parallel to the "bit for bit" match detectors 404–407 that accompany each CAM word 400–403. A match signal is generated for each match between a bit in the comparand register 303 and a corresponding bit in the CAM word (400–403). As each MATCH signal is generated, it is forwarded to a respective category association table 500–503. Thus, each CAM word (400–403) is assigned to a category association table, which in turn points to one of a plurality of categorized priority encoders (504–507). The priority encoders 504–507 encode the highest priority match from which an address of a word can be deduced. A given category association table (e.g., 503) may simultaneously point to several priority encoders (e.g., 504–507). As a result, a plurality of respective outputs from the plurality of categorized priority encoders are simultaneously available, with each categorized priority encoder pointing to the address of the highest priority data identified in its respective category.

Figure 2:
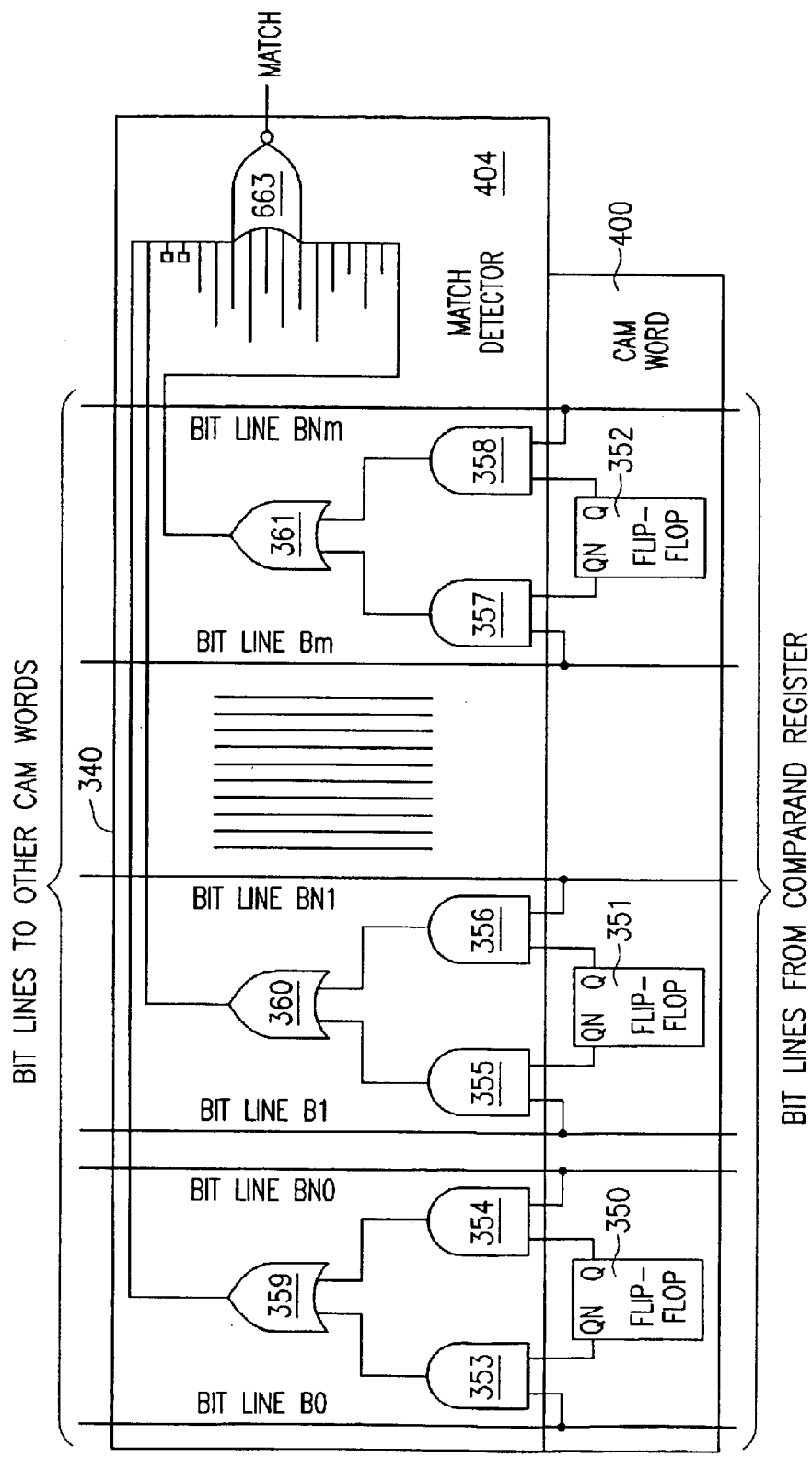
FIG. 2 illustrates a bit-for-bit match detection circuit as implemented in the FIG. 1 embodiment.

FIG. 2 discloses in further detail the "it for bit" match detector (e.g., 404) for each CAM word (e.g., 400). Bit lines from the comparand register (BIT LINE B0–BIT LINE Bm) connect through each CAM word in parallel and are outputted 340 at the same bit line location at ea h CAM word. The bit lines are also connected to one input of an AND gate 353–358 in the match detector 404. Flip flops 350–352 are used as a memory device r each bit in the CAM word 400, wherein each output (Q) and complement (QN) is connected to a respective second input of the AND gates (353–358) as shown in FIG. 2. Each two AND gates associated with one bit (353–354, 355–356 & 357–358) are then connected to the inputs of a respective OR gate (359–361). The output of each OR gate 359–361 is then connected to an input terminal of an NOR gate 663. This gate combination is used to compare the data stored in the CAM word 400 with the corresponding data stored in the comparand register 303. As will be discussed below, each time any of the outputs on OR gates 359–361 are logic "0," then NOR gate 663 outputs a MATCH signal to a respective category association table 500–503, disclosed below.

The logic function generated by each group of gates 353–361 is an exclusive OR (EXOR) function $[(B_m * QN_m) + (BN_m * Q_m)]$. Whenever there is a mismatch, the Q output of a CAM word flip-flop will be the same as the respectively compared bit $BN_m$ from the comparand register 303, providing a logic "1" output on the respective OR gate (359–361). Conversely, if there is a match, then the output on the respective OR gate (359–361) will be a logic "0." If the outputs from all the OR gates 359–361 are "0," then there is a match between the unmasked bits in the comparand register 303 and the corresponding bits in the CAM word (e.g., 400).

Figure 3:
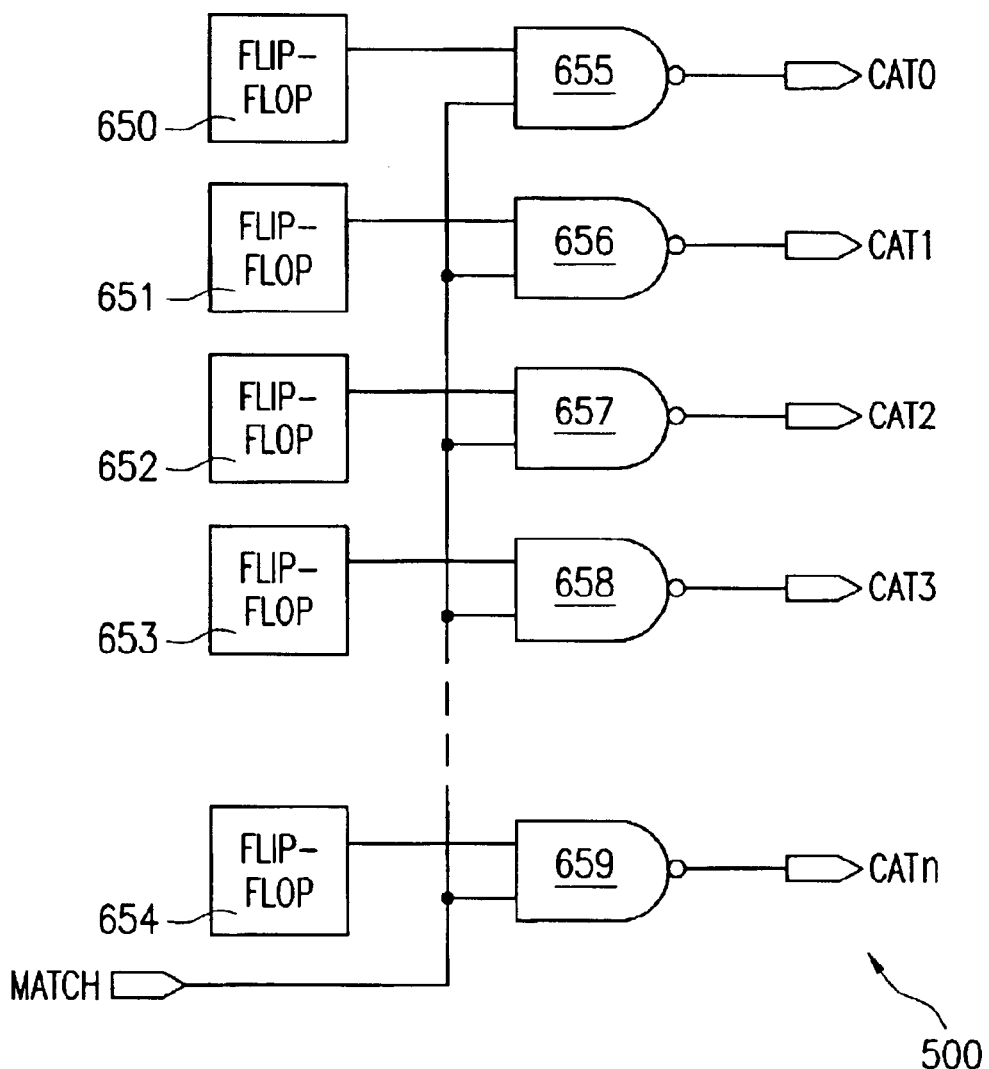
FIG. 3 illustrates a category association table employed in the FIG. 1 priority match detection and categorization circuit.

FIG. 3 discloses in greater detail a category association table 500 of FIG. 1, wherein the match line is connected to one input of NAND gates 655–659. Flip-flops 650–654 provide a stored priority code for each CAM word, which is inputted into another input of a respective NAND gates 655–659. The output of each NAND gates 655–659 provides a bit pattern priority code (CAT0–CATn) which indicates which priority encoder 504–507 (of FIG. 1) will be used to process a match on a given CAM word 400–403. A bit pattern priority code (CAT0–CATn) is indicated by a logic "low" at each output if the detected match has a priority code equal to the corresponding stored flip-flop priority value. This stored bit pattern priority code points to a specific one or more of priority encoders (504–507) for priority encoding the matching words as a result of a CAM memory search.

Figure 4:
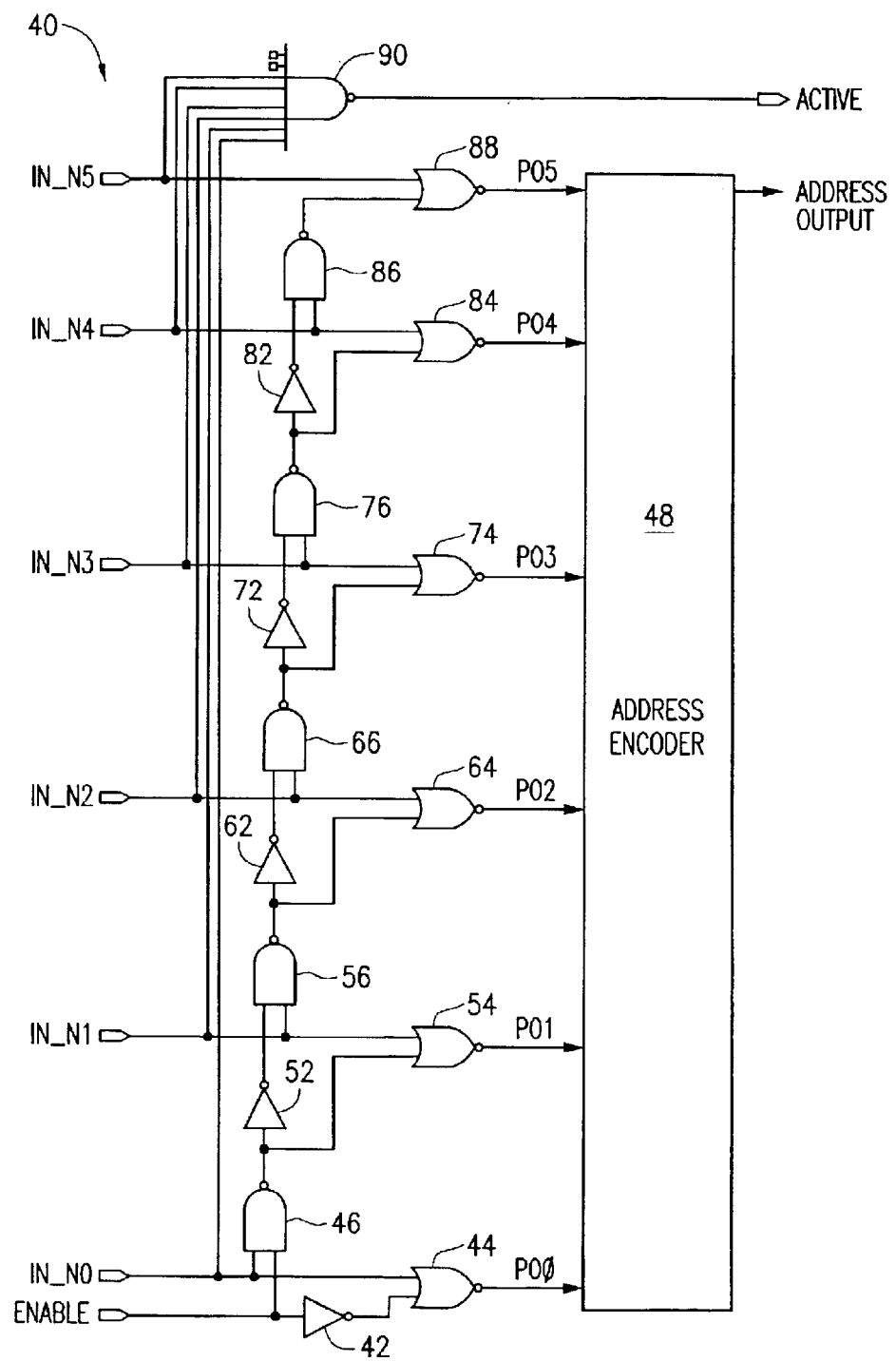
FIG. 4 illustrates an exemplary embodiment of a priority encoder circuit used in the match detection and categorization circuit of FIG. 1.

FIG. 4 illustrates a typical priority encoder 40, such as could be used as any one of priority encoders 504–507 of FIG. 1. Priority encoder 40 receives a plurality of inputs from different category association tables 500–503. Priority encoder 40 utilizes a "thermometer" type of arrangement of logic gates to determine which of the inputs has the highest priority. Priority encoder 40 is arranged as a series of stages arranged from bottom to top, each stage having progressively lower priority, with the highest priority shown at the bottom.

In the exemplary embodiment of FIG. 4, each priority encoder 40 stage includes a NOT gate, a NAND gate, and a NOR gate. A highest priority stage includes NOT gate 42, which inverts an ENABLE signal and supplies it to NOR gate 44. NOR gate 44 also receives a signal on match line input IN__N0. ENABLE also is supplied to NAND gate 46, along with match line input N0. The result from NOR gate 44 is supplied on output terminal PO0 to an address encoder 48. Address encoder 48 provides an address output corresponding to the highest priority match line detected by the priority encoder for a given category of data.

Priority encoder 40 includes several stages, of which six are shown in FIG. 4. Thus, the result from NAND gate 46 is supplied to the next lower priority stage (physically higher on the "thermometer") made up similarly of NOT gate 52, NOR gate 54, and NAND gate 56. NOR gate 54 supplies a signal to output terminal PO1, and NAND gate 56 supplies its signal to the third lowest priority stage made up of NOT gate 62, NOR gate 64, and NAND gate 66, the stage delivering an output signal on PO2. Similar fourth- and fifth-lowest priority stages are shown which include NOT gates 72 and 82, NOR gates 74 and 84, and NAND gates 76 and 86, respectively, the stages providing output signals on PO3 and PO4 to address encoder 48. A final sixth stage includes NOR gate 88, providing its output signal on PO5.

In operation, matches are indicated on input match lines IN__N0–IN__N6 as logic 0, the ENABLE signal having a logic high. Input lines IN__N0–IN__N6 correspond to the output signals CAT0–CATn of category association table (e.g., 500) shown in FIG. 3. In the first stage, if match line IN__N0 is low, output PO0 will be high, indicating a highest priority match. Priority encoder 40 includes an ACTIVE output, which goes to a logic "low" every time any input to the priority encoder is active. The ACTIVE signal is provided by multiple-input NAND gate 90, while receiving input signals from each of the signal lines IN__N0–IN__N5.

Figure 5:
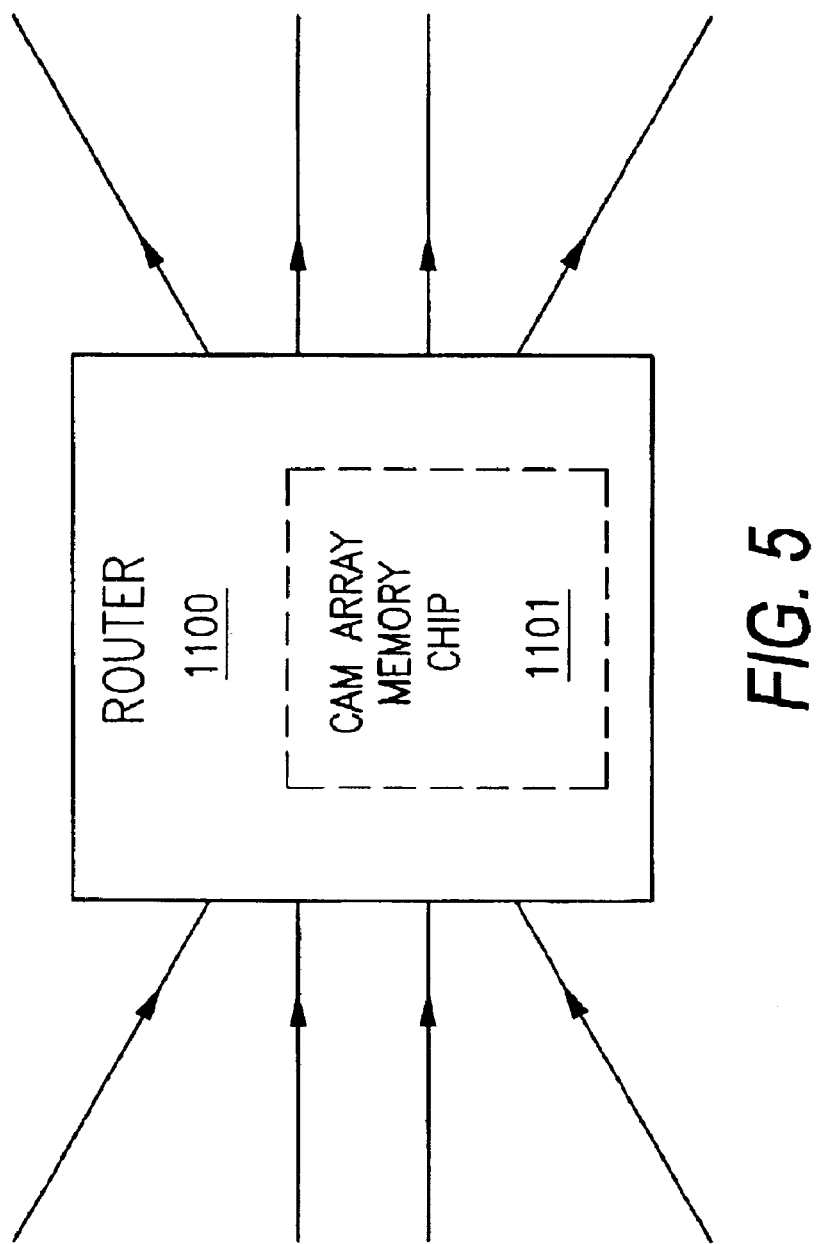
FIG. 5 depicts a simplified block diagram of a router employing the FIG. 1 priority match detection and categorization circuit in accordance with another exemplary embodiment of the invention.

FIG. 5 is a simplified block diagram of a router 1100 connected to a CAM array memory chip 1101 as may be used in a communications network, such as, e.g., part of the Internet backbone. The router 1100 contains a plurality of input lines and a plurality of output lines. When data is transmitted from one location to another, it is sent in a form known as a packet. Oftentimes, prior to the packet reaching its final destination, that packet is first received by a router, or some other device. The router 1100 then decodes that part of the data identifying the ultimate destination and decides which output line and what forwarding instructions are required for the packet.

Generally, CAMs are also very useful in router applications because historical routing information for packets received from a particular source and going to a particular destination is stored in the CAM of the router. As a result, when a packet is received by the router 1100, the router already has the forwarding information stored within its CAM. Therefore, only that portion of the packet that identifies the sender and recipient need be decoded in order to perform a search of the CAM to identify which output line and instructions are required to pass the packet onto a next node of its journey.

Still referring to FIG. 5, router 1100 contains the added benefit of employing a semiconductor memory chip containing a priority match detection and categorization circuit, such as that depicted in FIGS. 1–4. Therefore, the CAM has the benefit of having category association features and processing in accordance with an exemplary embodiment of the invention.

Figure 6:
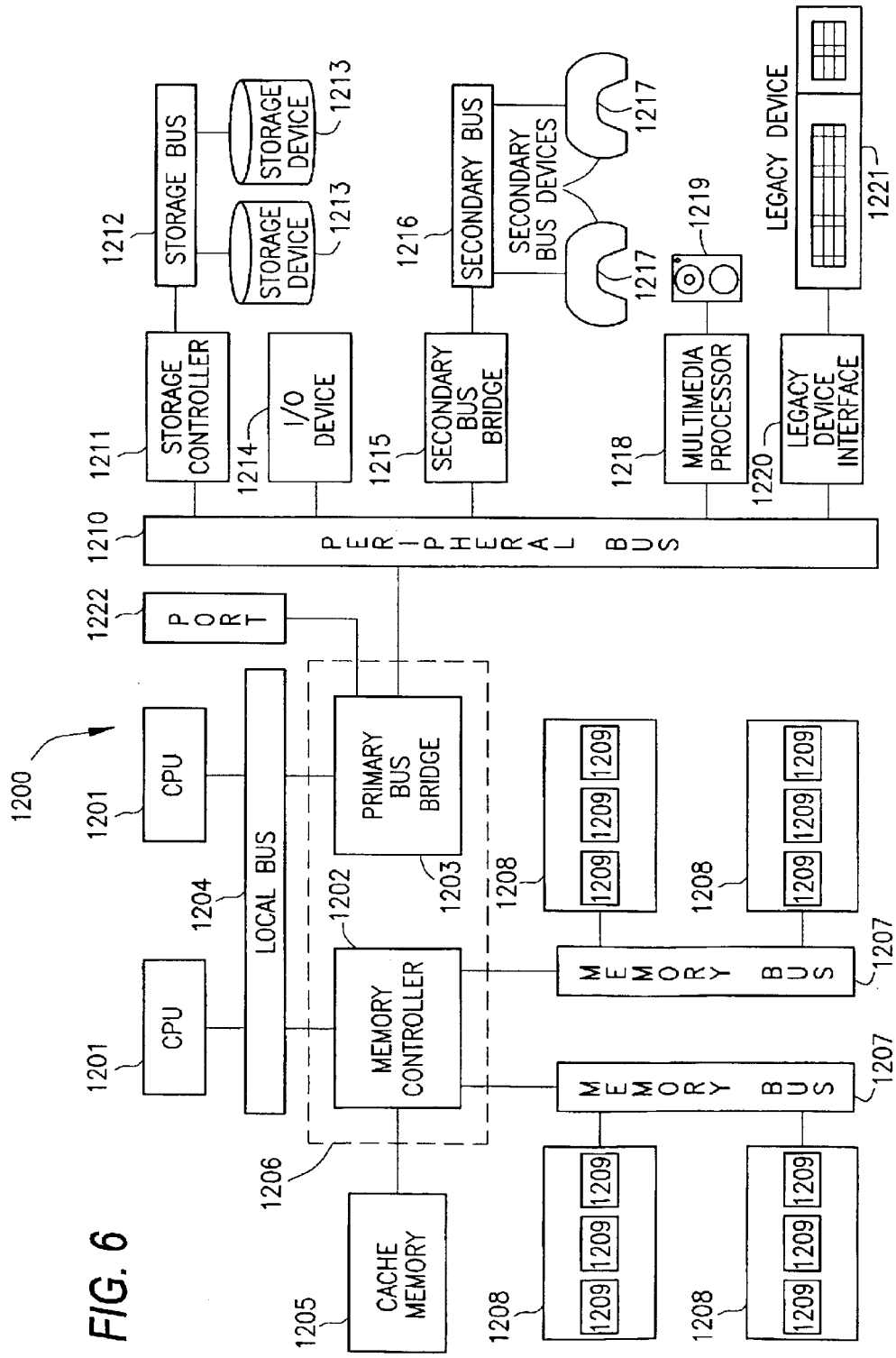
FIG. 6 depicts a block diagram of a processor system employing the FIG. 1 priority match detection and categorization circuit, in accordance with yet another exemplary embodiment of the invention.

FIG. 6 illustrates an exemplary processing system 1200 which utilizes a CAM match detection circuit such as, for example, the priority match detection and categorization circuit described in connection with FIGS. 1–4. The processing system 1200 includes one or more processors 1201 coupled to a local bus 1204. A memory controller 1202 and a primary bus bridge 1203 are also coupled the local bus 1204. The processing system 1200 may include multiple memory controllers 1202 and/or multiple primary bus bridges 1203. The memory controller 1202 and the primary bus bridge 1203 may be integrated as a single device 1206.

The memory controller 1202 is also coupled to one or more memory buses 1207. Each memory bus accepts memory components 1208. Any one of memory components 1208 may contain a CAM array performing priority match detection and categorization as described in connection with FIGS. 1–4.

The memory components 1208 may be a memory card or a memory module. The memory components 1208 may include one or more additional devices 1209. For example, in a SIMM or DIMM, the additional device 1209 might be a configuration memory, such as a serial presence detect (SPD) memory. The memory controller 1202 may also be coupled to a cache memory 1205. The cache memory 1205 may be the only cache memory in the processing system. Alternatively, other devices, for example, processors 1201 may also include cache memories, which may form a cache hierarchy with cache memory 1205. If the processing system 1200 include peripherals or controllers which are bus masters or which support direct memory access (DMA), the memory controller 1202 may implement a cache coherency protocol. If the memory controller 1202 is coupled to a plurality of memory buses 1207, each memory bus 1207 may be operated in parallel, or different address ranges may be mapped to different memory buses 1207.

The primary bus bridge 1203 is coupled to at least one peripheral bus 1210. Various devices, such as peripherals or additional bus bridges may be coupled to the peripheral bus 1210. These devices may include a storage controller 1211, a miscellaneous I/O device 1214, a secondary bus bridge 1215, a multimedia processor 1218, and a legacy device interface 1220. The primary bus bridge 1203 may also be coupled to one or more special purpose high speed ports 1222. In a personal computer, for example, the special purpose port might be the Accelerated Graphics Port (AGP), used to couple a high performance video card to the processing system 1200.

The storage controller 1211 couples one or more storage devices 1213, via a storage bus 1212, to the peripheral bus 1210. For example, the storage controller 1211 may be a SCSI controller and storage devices 1213 may be SCSI discs. The I/O device 1214 may be any sort of peripheral. For example, the I/O device 1214 may be an local area network interface, such as an Ethernet card. The secondary bus bridge may be used to interface additional devices via another bus to the processing system. For example, the secondary bus bridge may be an universal serial port (USB) controller used to couple USB devices 1217 via to the processing system 1200. The multimedia processor 1218 may be a sound card, a video capture card, or any other type of media interface, which may also be coupled to one additional device such as speakers 1219. The legacy device interface 1220 is used to couple legacy devices, for example, older styled keyboards and mice, to the processing system 1200.

The processing system 1200 illustrated in FIG. 6 is only an exemplary processing system with which the invention may be used. While FIG. 6 illustrates a processing architecture especially suitable for a general purpose computer, such as a personal computer or a workstation, it should be recognized that well known modifications can be made to configure the processing system 1200 to become more suitable for use in a variety of applications. For example, many electronic devices which require processing may be implemented using a simpler architecture which relies on a CPU 1201 coupled to memory components 1208 and/or memory devices 1209. The modifications may include, for example, elimination of unnecessary components, addition of specialized devices or circuits, and/or integration of a plurality of devices.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention has been described in connection with specific circuits employing different configurations of p-type and n-type transistors, the invention may be practiced with many other configurations without departing from the spirit and scope of the invention. In addition, although the invention is described in connection with flip-flop memory cells, it should be readily apparent that the invention may be practiced with any type of memory cell. It is also understood that the logic structures described in the embodiments above can substituted with equivalent logic structures to perform the disclosed methods and processes. Accordingly, the invention is not limited by the foregoing description or drawings, but is only limited by the scope of the appended claims.

What is claimed as new and desired to be protected by Letters Patent of the United States is:

1. A circuit for associating searched CAM words to a category of priority encoders, comprising:
   a plurality of bit-for-bit detection circuits, each bit-for-bit detection circuit being associated with a corresponding CAM word for comparing said corresponding CAM word to a comparand, each of said detection circuits having an output terminal;
   a plurality of logic gates, each of said plurality of logic gates having one terminal coupled to an output terminal from one of said plurality of bit-for-bit detection circuits; and
   a plurality of storage devices associated with each CAM word, each of said storage devices connected to a second terminal of a respective logic gate wherein the plurality of logic gates are adapted to output a category association signal.

2. The circuit according to claim 1, wherein the logic gates are NAND gates.

3. The circuit according to claim 1, wherein the storage devices are flip-flops.

4. The circuit according to claim 3, wherein each flip-flop is adapted to store a stored bit of a CAM priority code for a corresponding CAM word.

5. The circuit according to claim 4, further comprising a plurality of priority encoders coupled to at least one of a plurality of category association tables for priority encoding a CAM word when the CAM word is a predetermined match with the comparand.

6. A method for categorizing CAM word searches, said method comprising:
   conducting bit-for-bit match detection on each of a plurality of CAM words to a comparand, and outputting a result from each CAM word;

processing each output with an associated category circuit, said processing including the performance of logical functions with selected bits of each CAM word; and generating a category code for each CAM word from said logical functions.

7. The method of claim 6, wherein the logical function is a NAND function.

8. The method of claim 6, wherein the selected bits are a stored priority code for a respective CAM word.

9. The method of claim 8, wherein the method further comprises selecting at least one of a plurality of encoders according to the priority code.

10. A processing system, comprising:

a processing unit;

a memory component coupled to said processing unit, said memory component containing a categorization circuit for a plurality of content addressable memories (CAMs), said categorization circuit comprising:

a plurality of bit-for-bit detection circuits, each bit-for-bit detection circuit being associated with a different CAM word for comparing said different CAM word to a comparand, each of said detection circuits having an output terminal;

a plurality of logic gates, each of said plurality of logic gates having one terminal coupled to an output terminal from one of said plurality of bit-for-bit detection circuits; and a plurality of storage devices associated with each CAM word, each of said storage devices connected to a second terminal of a respective logic gate, wherein the plurality of logic gates are adapted to output a category association signal.

11. The processing system according to claim 10, wherein the logic gates are NAND gates.

12. The processing system according to claim 10, wherein the storage devices are flip-flops.

13. The processing system according claim 12, wherein each flip-flop is adapted to store a stored bit of a CAM priority code for a corresponding CAM word.

14. The processing system according to claim 13, further comprising a plurality of priority encoders coupled to at least one of a plurality of category association tables for priority encoding a CAM word when the CAM word is a predetermined match with the comparand.

15. A content addressable memory, comprising:

a plurality of bit-for-bit detection circuits, each bit-for-bit detection circuit being associated with a corresponding CAM word for comparing said corresponding CAM word to a comparand, each of said detection circuits having an output terminal; and a category priority encoder selectively coupled to an output terminal from each of said plurality of bit-for-bit detection circuits for determining the priority of said bit-for-bit detection circuits belonging to a category having a match.

16. A content addressable memory as claim 15, further comprising a plurality of storage devices associated with each CAM word.

17. A content addressable memory as claim 15, further comprising a plurality of category association tables coupled between said each bit-for-bit detection circuit and said category priority encoder for selectively coupling a bit-for-bit detection circuit to a category priority encoder.

18. A content addressable memory as claim 16, wherein said each category association table is adapted to receive a priority code to determine selectively coupling a bit-for-bit detection circuit to said category priority encoder.

19. A content addressable memory as claim 18, further comprising a second category priority encoder coupled to an output terminal from each one of said plurality of bit-for-bit detection circuits.

20. A content addressable memory as in claim 19, wherein each category association table is adapted to receive a second priority code to determine selectively coupling a bit-for-bit detection circuit to said second category priority encoder.

* * * * *

UNITED STATES PATENT AND TRADEMARK OFFICE
CERTIFICATE OF CORRECTION

PATENT NO. : 6,944,710 B2
DATED : September 13, 2005
INVENTOR(S) : Alon Regev et al.

It is certified that error appears in the above-identified patent and that said Letters Patent is hereby corrected as shown below:

Column 1,
Line 25, "algorithm" should read -- algorithms --;
Lines 44-45, "particular memory of dRAMs can be" should read -- particular category of data. (new paragraph) CAMs can be --;

Column 3,
Line 7, "it for bit" should read -- bit for bit --;
Line 11, "ea h" should read -- each --;
Line 14, "device r each" should read -- device for each --;
Line 32, "BN,sub.m" should read -- BN.sub.m --;

Column 5,
Line 5, "coupled the" should read -- coupled to the --;
Line 27, "1200 include" should read -- 1200 includes --;
Line 52, "an local" should read -- a local --;
Line 56, "an universal" should read -- a universal --; and Column 6,
Lines 28-29, "can substituted" should read -- can be substituted --.

Signed and Sealed this

Thirtieth Day of May, 2006

JON W. DUDAS
*Director of the United States Patent and Trademark Office*